United States Patent
Weaver

(10) Patent No.: US 11,340,529 B2
(45) Date of Patent: May 24, 2022

(54) DRY FILM FORMULATION

(71) Applicant: FUNAI ELECTRIC CO., LTD., Osaka (JP)

(72) Inventor: Sean T. Weaver, Lexington, KY (US)

(73) Assignee: FUNAI ELECTRIC CO. LTD

(*) Notice: Subject to any disclaimer, the term of this patent is extended or adjusted under 35 U.S.C. 154(b) by 167 days.

(21) Appl. No.: 16/505,829

(22) Filed: Jul. 9, 2019

(65) Prior Publication Data

US 2021/0011382 A1 Jan. 14, 2021

(51) Int. Cl.
| | |
|---|---|
| *G03F 7/075* | (2006.01) |
| *G03F 7/30* | (2006.01) |
| *B41J 2/14* | (2006.01) |
| *G03F 7/004* | (2006.01) |
| *G03F 7/038* | (2006.01) |

(52) U.S. Cl.
CPC ........ *G03F 7/0751* (2013.01); *B41J 2/14233* (2013.01); *G03F 7/0048* (2013.01); *G03F 7/038* (2013.01); *G03F 7/0752* (2013.01); *G03F 7/30* (2013.01); *B41J 2002/1425* (2013.01)

(58) Field of Classification Search
CPC ........ G03F 7/0751; G03F 7/0048; G03F 7/30; B41J 2/14233; B41J 2/14201; B41J 2/1425
See application file for complete search history.

(56) References Cited

U.S. PATENT DOCUMENTS

| | | | |
|---|---|---|---|
| 8,173,031 B2 | 5/2012 | Weaver et al. | |
| 9,664,830 B2* | 5/2017 | Hasegawa | G02B 1/113 |
| 2007/0076060 A1* | 4/2007 | Weaver | B41J 2/1603 |
| | | | 347/68 |
| 2016/0318328 A1* | 11/2016 | Satou | C04B 41/52 |
| 2019/0056659 A1 | 2/2019 | Craft et al. | |

FOREIGN PATENT DOCUMENTS

WO 2018184151 A1 10/2018

OTHER PUBLICATIONS

MOMENTIVE: "CoatOSil* MP200 Silane for Waterborne and Solventborne Coatings," Jan. 1, 2017, pp. 1-3.

* cited by examiner

*Primary Examiner* — John S Chu
(74) *Attorney, Agent, or Firm* — Luedeka Neely Group, PC

(57) ABSTRACT

An improved photoimageable dry film formulation, a fluidic ejection head containing a thick film layer derived from the improved photoimageable dry film formulation, and a method for making a fluidic ejection head. The improved photoimageable dry film formulation includes a multifunctional epoxy compound, a photoinitiator capable of generating a cation, a non-photoreactive solvent, and from about 0.5 to about 5% by weight a silane oligomer adhesion enhancer based on a total weight of the photoimageable dry film formulation before drying.

14 Claims, 4 Drawing Sheets

DRY FILM FORMULATION

TECHNICAL FIELD

The disclosure relates to improved photoresist dry film layers and in particular to photoresist dry film layers having improved formulations for making thick film laminates.

BACKGROUND AND SUMMARY

Photoresist dry film layers are useful for a wide variety of electronic devices, including but not limited to, fluid jet ejection devices, vaporization devices, and micro-electronic structures. Fluid jet ejection devices include fluidic ejection heads that are useful for ejecting a variety of fluids including inks, cooling fluids, pharmaceuticals, lubricants, vaporizing fluids, and the like. Devices that use fluidic ejection heads continue to be improved as the technology for making the fluidic ejection heads continues to advance. New techniques are constantly being developed to provide low cost, highly reliable fluidic ejection heads for fluid ejection devices for a wide variety of applications.

Fluidic ejection heads used in fluid jet ejection devices have a relatively complicated structure that includes electrical circuits, fluid passageways and a variety of tiny parts assembled with precision to provide a powerful, yet versatile fluidic ejection head. The components of the fluidic ejection head must cooperate with each other and with a variety of fluid formulations to provide the desired characteristics for ejecting fluid therefrom. Accordingly, it is important to match the ejection head components to the fluid and the duty cycle demanded by the fluid ejection device using the fluidic ejection head. Slight variations in production quality can have a tremendous influence on the product yield and resulting fluid ejection performance.

During the fabrication of a fluidic ejection head, photoimageable materials may be used to provide a fluid flow layer and/or a nozzle plate layer. In the preparation of a photoimageable material, a photoresist resin formulation is applied as a liquid to a release film and the formulation is dried on the release film. The release film is then removed from the dry photoimageable material and the dry photoimageable material is laminated to a silicon semiconductor substrate or to a flow feature layer on the silicon semiconductor substrate. The photoimageable material is then imaged and developed to provide a variety of fluid flow features and/or nozzle holes. In some cases, a fluid flow layer containing fluid ejection chambers and fluid flow channels is applied directly to a silicon semiconductor substrate as a spin coated layer and a nozzle plate layer is laminated as a dry film to the fluid flow layer, in other cases, the fluid flow layer is laminated as a dry film to the silicon semiconductor substrate and a nozzle plate is laminated as a dry film to the fluid flow layer.

Due to the different chemical and physical properties of the silicon substrate and fluid flow layer, suitable adhesion of the fluid flow layer to the silicon substrate cannot be achieved without the use of surface treatment of the silicon substrate and/or the use of an adhesion enhancer in the fluid flow layer. Likewise, adhesion between the nozzle plate and the fluid flow layer is important and requires the use of an adhesion enhancer in the formulation for the dry film photoresist material used to make the nozzle plate layer. However, it was discovered that a considerable amount of adhesion enhancer is lost during the step of drying photoresist formulations on the release film. Loss of the adhesion enhancer during the drying step has led to poorer adhesion between the fluid flow layer and the substrate and/or between the fluid flow layer and the nozzle plate layer. Accordingly, what is needed is an improved dry film photoresist formulation that does not suffer from significant loss of the adhesion enhancer during the photoresist formulation drying step.

In view of the foregoing, exemplary embodiments of the disclosure provide an improved photoimageable dry film formulation, a fluidic ejection head containing a thick film layer derived from the improved photoimageable dry film formulation, and a method for making a fluidic ejection head. The improved photoimageable dry film formulation includes a multifunctional epoxy compound, a photoinitiator capable of generating a cation, a non-photoreactive solvent, and from about 0.5 to about 5% by weight a silane oligomer adhesion enhancer based on a total weight of the photoimageable dry film formulation before drying.

In another embodiment, there is provided a method for making an improved fluidic ejection head. The method includes applying a photoresist layer to a release film, wherein the photoresist layer is derived from a photoimageable dry film formulation comprising a multi-functional epoxy compound, a photoacid generator, a silane oligomer adhesion enhancer, and an aryl ketone solvent. The photoimageable dry film formulation on the release film layer is dried to provide a thick film layer. The thick film layer is laminated to a flow feature layer on a semiconductor substrate. Then the release film is removed from the thick film layer. Nozzle holes are imaged in the thick film layer and the imaged thick film layer is developed to provide a nozzle plate for the fluidic ejection head.

A further embodiment provides a fluidic ejection head for ejecting a fluid composition. The fluidic ejection head includes a semiconductor substrate containing fluid ejection devices thereon, A flow feature layer disposed on the semiconductor substrate, and a thick film layer is laminated to the flow feature layer. The thick film layer is derived from a photoimageable dry film formulation comprising a multi-functional epoxy compound, a photoinitiator capable of generating a cation, a non-photoreactive solvent, and from about 0.5 to about 5% by weight a silane oligomer adhesion enhancer based on a total weight of the photoimageable dry film formulation before drying.

In some embodiments, the photoimageable dry film formulation includes from about 1 to about 3 wt. % of the silane oligomer adhesion enhancer based on a total weight of the photoimageable dry film formulation before drying.

In some embodiments, the photoimageable dry film formulation includes an aliphatic ketone solvent. In other embodiments, the aliphatic ketone solvent includes cyclohexanone, and optionally, acetone.

In some embodiments, the silane oligomer adhesion enhancer is an alkoxysilane oligomer compound. In other embodiments, the alkoxysilane oligomer compound is a gamma-glycidoxypropyltrimethoxysilane oligomer of the formula

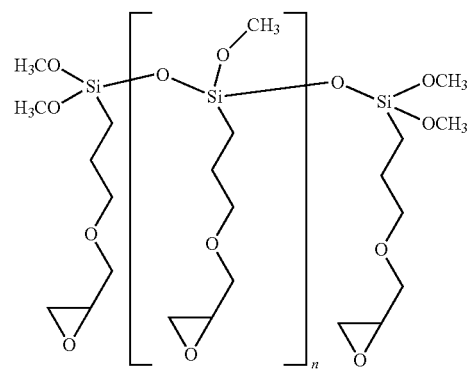

wherein n ranges from 1 to 4.

In some embodiments, the photoimageable dry film formulation on the release film is dried at a temperature ranging from about 110° to about 150° C.

In some embodiments, a dry film laminate made from the photoimageable dry film formulation is applied to a silicon semiconductor substrate.

In other embodiments, a dry film laminate made from the photoimageable dry film formulation is applied to a flow feature layer of a fluidic ejection head.

An advantage of the embodiments described herein is that the dry film photoimageable layer has improved adhesion between the semiconductor substrate and fluid flow layer and between the fluid flow layer and the nozzle plate compared to dry film photoimageable layers made with conventional adhesion enhancers.

BRIEF DESCRIPTION OF THE DRAWINGS

Further features and advantages of the disclosed embodiments may become apparent by reference to the detailed description when considered in conjunction with the figures, which are not to scale, wherein like reference numbers indicate like elements through the several views, and wherein.

DETAILED DESCRIPTION OF THE PREFERRED EMBODIMENTS

Figure 1:
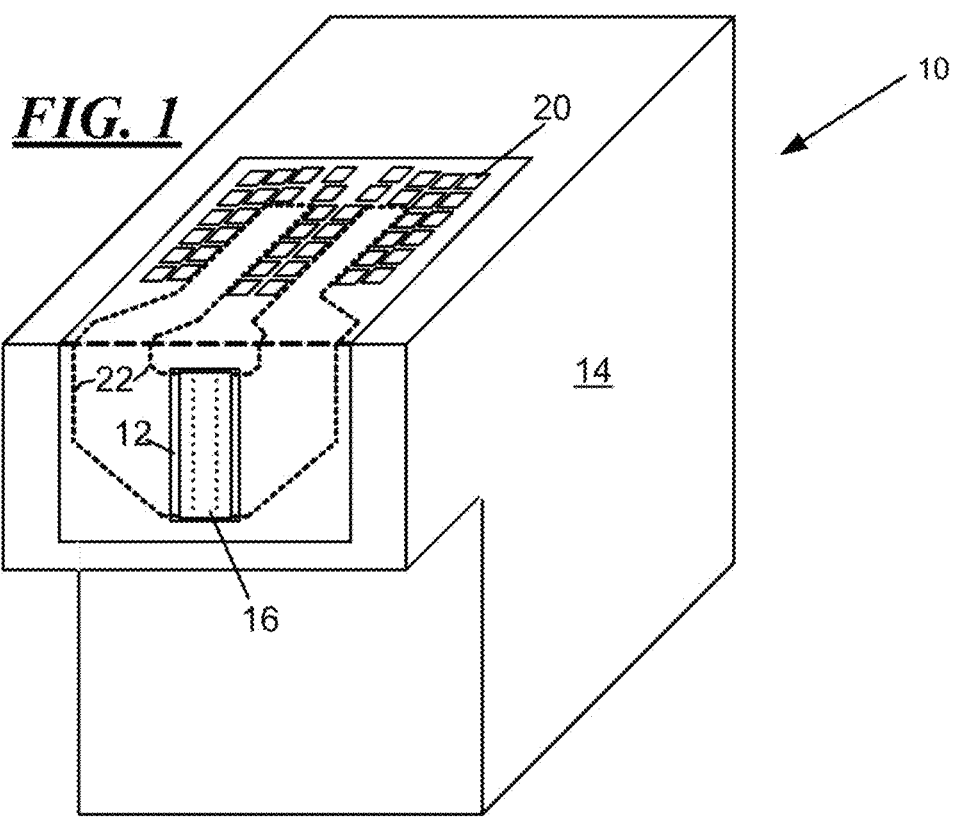
FIG. 1 is a perspective view, not to scale, of a fluid ejection cartridge containing a fluidic ejection head thereon.
Figure 2:
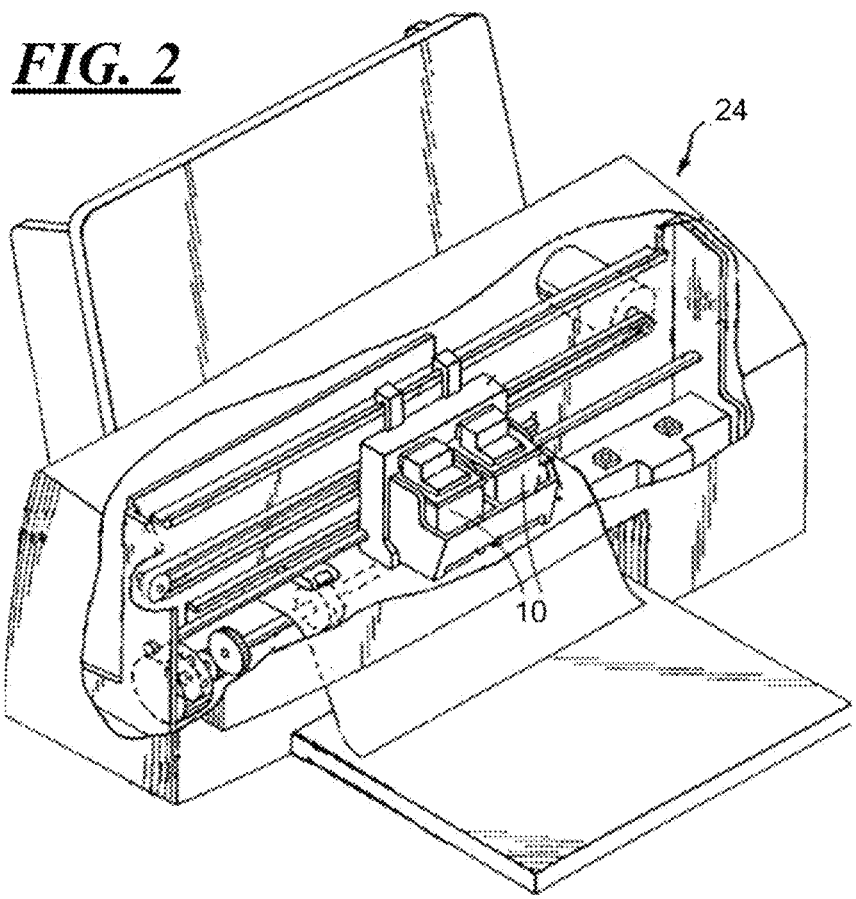
FIG. 2 is a perspective view, not to scale of a fluid ejection device for ejecting fluid from an ejection head made according to the disclosure.

As set forth above, embodiments of the disclosure relate to improved photoimageable dry film formulations for fluidic ejection heads. A representative fluid ejection cartridge 10 containing a fluidic ejection head 12 is illustrated in FIG. 1. The fluid ejection cartridge 10 includes a cartridge body 14 for containing the fluidic ejection head 12 thereon. As described in more detail below, the ejection head 12 includes a nozzle plate 16 that is attached to the fluid flow layer, which in turn is attached to the silicon substrate containing fluid ejectors thereon. In a prior art fluidic ejection head, a nozzle plate made of a polyimide material is laser ablated and then attached by means of an adhesive to the fluid flow layer on the substrate. Such prior art process requires separate processing steps for the nozzle plate and difficult alignment techniques that are avoided by the use of the photoimageable dry film formulations described herein.

A flexible circuit 18 containing electrical contacts 20 is electrically connected to the fluid ejectors on the silicon substrate by means of electrical traces 22. The fluid ejection cartridges 10 may be used in a devices such as an ink jet printer 24, however, the embodiments of the disclosure are not limited to fluidic ejection heads 12 for ink jet printers 24.

In order to prepare a fluidic ejection head 12 having improved properties, according to embodiments of the disclosure, a slot die coating method for applying a liquid photoresist composition to a moving web of release film is used to provide a photoimageable layer on the release film. The liquid photoresist composition is provided to a slot die coater that includes a closed pressure vessel containing a die outlet. The slot die coater delivers the photoresist composition to the surface of the moving web of release film at a rate of about 3 to about 50 meters per minute. The photoresist composition on the release film is then dried to provide a photoimageable layer that can be laminated to a silicon substrate or to a fluid flow layer on a silicon substrate.

A suitable liquid photoresist composition may be formulated to include one or more of a multi-functional epoxy compound, a di-functional epoxy compound, a relatively high molecular weight polyhydroxy ether, an adhesion enhancer, a photoinitiator, and an aliphatic ketone solvent. For purposes of the disclosure, "difunctional epoxy" means epoxy compounds and materials having only two epoxy functional groups in the molecule. "Multifunctional epoxy" means epoxy compounds and materials having two or more epoxy functional groups in the molecule. A typical photoresist composition is set forth in the following table.

TABLE 1

| Component | Weight Percent |
| --- | --- |
| Epoxy resin mixture | 53.0 |
| Adhesion enhancer | 1.2 |
| Photoacid generator | 11.8 |
| Solvent | 34.0 |

A multifunctional epoxy component that may be used in a photoresist composition according to the disclosure may be selected from aromatic epoxides such as glycidyl ethers of polyphenols. An exemplary first multi-functional epoxy resin is a polyglycidyl ether of a phenolformaldehyde novolac resin such as a novolac epoxy resin having an epoxide gram equivalent weight ranging from about 190 to about 250 and a viscosity at 130° C. ranging from about 10 to about 60.

The multi-functional epoxy component of the photoresist composition may have a weight average molecular weight of about 3,000 to about 5,000 Daltons as determined by gel permeation chromatography, and an average epoxide group functionality of greater than 3, preferably from about 6 to about 10. The amount of multifunctional epoxy resin in an exemplary photoresist composition may range from about 30 to about 50 percent by weight based on the total weight of the cured photoimageable layer.

The di-functional epoxy component of the photoresist composition may be selected from di-functional epoxy compounds which include diglycidyl ethers of bisphenol-A, 3,4-epoxycyclohexylmethyl-3,4-epoxycyclo-hexene carboxylate, 3,4-epoxy-6-methylcyclohexyl-methyl-3,4-epoxy-6-methylcyclohexene carboxylate, bis(3,4-epoxy-6-methylcyclohexylmethyl) adipate, and bis(2,3-epoxycyclopentyl) ether.

An exemplary di-functional epoxy component is a bisphenol-A/epichlorohydrin epoxy resin having an epoxide equivalent of greater than about 1000. An "epoxide equivalent" is the number of grams of resin containing 1 gram-equivalent of epoxide. The weight average molecular weight of the di-functional epoxy component is typically above 2500 Daltons, e.g., from about 2800 to about 3500 weight average molecular weight. The amount of the di-functional epoxy component in the photoresist composition may range from about 30 to about 50 percent by weight based on the total weight of the cured photoimageable layer.

In some embodiments, in order to enhance the flexibility of the cured photoimageable layer for lamination purposes, a second di-functional epoxy compound may be included in the formulation. The second di-functional epoxy compound typically has a weight average molecular weight of less than the weight average molecular weight of the di-functional epoxy compound described above. In particular, the weight average molecular weight of the second di-functional epoxy compound may range from about 250 to about 400 Daltons. Substantially equal parts of the di-functional epoxy compounds may be used in the photoresist composition. A suitable second di-functional epoxy compound may be selected from diglycidyl ethers of bisphenol-A. The total amount of di-functional epoxy compounds in the photoresist composition may range from about 40 to about 60 percent by weight based on the total weight of the cured photoimageable layer.

Another component of the photoresist composition is a relatively high molecular weight polyhydroxy ether compound of the formula:

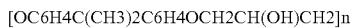

[OC6H4C(CH3)2C6H4OCH2CH(OH)CH2]n having terminal alpha-glycol groups, wherein n is an integer from about 35 to about 100. Such compounds are made from the same raw materials as epoxy resins, but contain no epoxy groups in the compounds. Such compounds are often referred to as phenoxy resins. Examples of suitable relatively high molecular weight phenoxy resins include, but are not limited to, phenoxy resins available from InChem Corporation of Rock Hill, S.C. under the trade names PKHP-200 and PKHJ. Such phenoxy resins have a solids content of about 99 weight percent, a Brookfield viscosity at 25° C. ranging from about 450 to about 800 centipoise, a weight average molecular weight in Daltons ranging from about 50,000 to about 60,000, a specific gravity, fused at 25° C., of about 1.18, and a glass transition temperature of from about 90° to about 95° C.

Phenoxy resins are particularly useful in making the photoimageable layer for laminating to a substrate, partially because they often do not crystallize or build up stress concentrations. Phenoxy resins have high temperature characteristics that enable stability over a wide temperature range including temperatures above about 38° C. The photoresist composition may contain from about 25 to about 35 percent by weight phenoxy resin based on the weight of the cured photoimageable layer.

Exemplary photoacid generators include compounds or mixture of compounds capable of generating a cation such as an aromatic complex salt which may be selected from onium salts of a Group VA element, onium salts of a Group VIA element, and aromatic halonium salts. Aromatic complex salts, upon being exposed to ultraviolet radiation or electron beam irradiation, are capable of generating acid moieties which initiate reactions with epoxides. The photoacid generator may be present in the photoresist composition in an amount ranging from about 5 to about 15 weight percent based on the weight of the cured photoimageable layer.

Compounds that generate a protic acid when irradiated by active rays, may be used as the photoacid generator, including, but not limited to, aromatic iodonium complex salts and aromatic sulfonium complex salts. Examples include di-(t-butylphenyl)iodonium triflate, diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, [4-(octyloxy)phenyl]phenyliodonium hexafluoroantimonate, triphenyl sulfonium triflate, triphenylsulfonium hexafluorophosphate, triphenylsulfonium hexafluoroantimonate, triphenylsulfonium tetrakis(pentafluorophenyl)borate, 4,4'-bis[diphenylsulfonium]diphenylsulfide, bis-hexafluorophosphate, 4,4'-bis[di([beta]-hydroxyethoxy) phenylsulfonium]diphenylsulfide bis-hexafluoroantimonate, 4,4'-bis[di([beta]-hydroxyethoxy)(phenylsulfonium)diphenyl sulfide-bishexafluorophosphate 7-[di(p-tolyl)sulfonium]-2-isopropylthioxanthone hexafluorophosphate, 7-[di(p-tolyl)sulfonio-2-isopropylthioxanthone hexafluoroantimonate, 7-[di(p-tolyl)sulfonium]-2-isopropyl tetrakis(pentafluorophenyl)borate, phenylcarbonyl-4'-diphenylsulfonium diphenylsulfide hexafluorophosphate, phenylcarbonyl-4'-diphenylsulfonium diphenylsulfide hexafluoroantimonate, 4-tert-butylphenylcarbonyl-4'-diphenylsulfonium diphenylsulfide hexafluorophosphate, 4-tert-butylphenylcarbonyl-4'-diphenylsulfonium diphenyl sulfide hexafluoroantimonate, 4-tert-butylphenylcarbonyl-4'-diphenylsulfonium diphenyl sulfide tetra-kis(pentafluorophenyl)borate, diphenyl [4-(phenylthio)phenyl]sulfonium hexafluoroantimonate and the like.

The photoresist composition preferably includes an effective amount of an adhesion enhancing agent such as a silane compound. Silane compounds that are compatible with the components of the photoresist composition typically have a functional group capable of reacting with at least one member selected from the group consisting of the multifunctional epoxy compound, the difunctional epoxy compound and the photoinitiator. Such an adhesion enhancing agent may be a silane with an epoxide functional group such as a glycidoxyalkyltrialkoxysilane, e.g., gamma-glycidoxypropyltrimethoxysilane. When used, the adhesion enhancing agent may be present in an amount ranging from about 0.5 to about 2 weight percent, such as from about 1.0 to about 1.5 weight percent based on total weight of the cured photoimageable layer, including all ranges subsumed therein. Adhesion enhancing agents, as used herein, are defined to mean organic materials soluble in the photoresist composition which assist the film forming and adhesion characteristics of the photoresist composition.

It has been discovered, quite surprisingly, that not all adhesion enhancing agents are suitable for use in dry film laminates made with the foregoing photoresist compositions. Accordingly, dry film photoimageable layers made with silane oligomer adhesion enhancing agents have been shown to provide increased resistance to delamination when exposed for a period of time to fluids used with the ejection heads 12. A suitable silane oligomer adhesion enhancer includes an epoxy silane oligomer compound.

The epoxy silane oligomer compound may be selected from gamma-glycidoxypropyl trimethoxysilane oligomer, gamma-glycidoxypropyl triethoxysilane oligomer, gamma-glycidoxypropyl methyldimethoxysilane oligomer, and a gamma-glycidoxypropyl methyldiethoxysilane oligomer. Other silane oligomer compounds that may be used include, but are not limited to, 3-methacryloxy propyl trimethoxy silane-tetra methoxy silane oligomer, 3-acryloxy propyl trimethoxy silane-tetra methoxy silane oligomer, vinyl trimethoxy silane-tetra methoxy silane oligomer, 3-amino propyl trimethoxy silane-tetra methoxy silane oligomer, 3-glycidoxy propyl trimethoxy silane, tetra ethoxy silane oligomer, 3-glycidoxy propyl methyl diethoxy silane-tetra methoxy silane oligomer, 3-glycidoxy propyl triethoxy silane-tetra methoxy silane oligomer, 2-(3, 4-epoxy cyclohexyl) ethyl trimethoxysilane-tetra ethoxy silane oligomer, such as tetra ethoxy silane oligomer.

In some embodiments, the silane oligomer is gamma-glycidoxypropyltrimethoxysilane oligomer of the formula

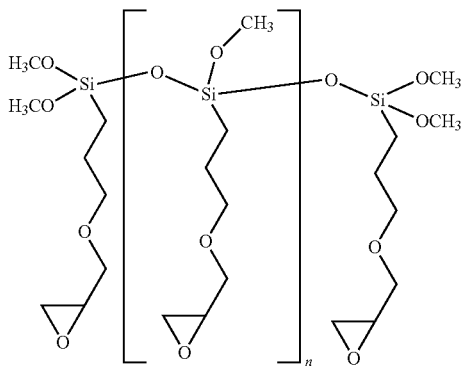

wherein n ranges from 1 to 4.

The following table provides surface adhesion data for photoresist compositions with and without silane adhesion components in the formulations and with and without silane adhesion materials coated on the surface of the substrate. Each of the formulations was cured on a silicon substrate and soaked in an ink formulation for 0, 2, 4, and 8 weeks prior to testing the adhesion properties of the photoresist layers. Table 2 provides the adhesion properties of a conventional photoresist composition containing a glycidoxypropyltrimethoxysilane adhesion promoter. Table 3 provides the adhesion properties of a photoresist composition devoid of an adhesion promoter with and without a glycidoxypropyltrimethoxysilane adhesion promoter coated on the surface of the substrate. Table 3 provides the adhesion properties of a photoresist composition devoid of an adhesion promoter with and without a glycidoxypropyltrimethoxysilane adhesion promoter coated on the surface of the substrate. Table 4 provides the adhesion properties of a photoresist composition containing 2 wt. % of a glycidoxypropyltrimethoxysilane oligomer adhesion promoter with and without a silane adhesion promoter coated on the surface of the substrate.

TABLE 2

| Sample No. | Composition | Surface silane | Initial Millinewtons | 2 Weeks Millinewtons | 4 Weeks Millinewtons | 8 Weeks Millinewtons |
| --- | --- | --- | --- | --- | --- | --- |
| 1A | Photoresist + silane | None | 447.35 | 378.68 | 377.94 | 394.57 |
| 1B | Photoresist + silane | None | 449.80 | 386.28 | 361.06 | 392.95 |
| 1C | Photoresist + silane | None | 437.19 | 384.12 | 373.82 | 392.58 |
| 1D | Photoresist + silane | None | 450.60 | 372.26 | 367.37 | 411.33 |
| 1E | Photoresist + silane | None | 452.58 | 391.45 | 367.67 | 381.00 |
| 1F | Photoresist + silane | None | 443.26 | 386.23 | 378.67 | 383.30 |
| 1G | Photoresist + silane | None | 450.88 | 388.12 | 377.14 | 406.96 |
| 1H | Photoresist + silane | None | 443.42 | 389.87 | 369.02 | 408.30 |
| 1I | Photoresist + silane | None | 452.98 | 377.71 | 368.50 | 398.25 |
| 1J | Photoresist + silane | None | 456.06 | 384.36 | 359.51 | 399.76 |

TABLE 3

| Sample No. | Composition | Surface silane | Initial Millinewtons | 2 Weeks Millinewtons | 4 Weeks Millinewtons | 8 Weeks Millinewtons |
| --- | --- | --- | --- | --- | --- | --- |
| 2A | Photoresist | Yes | 483.66 | 100.87 | 142.30 | 194.00 |
| 2B | Photoresist | Yes | 473.66 | 105.07 | 156.94 | 177.41 |
| 2C | Photoresist | Yes | 496.99 | 106.92 | 177.93 | 221.39 |
| 2D | Photoresist | Yes | 481.08 | 103.12 | 139.69 | 159.39 |
| 2E | Photoresist | Yes | 481.05 | 106.04 | 137.36 | 221.31 |
| 2F | Photoresist | Yes | 474.02 | 99.24 | 144.81 | 155.18 |
| 2G | Photoresist | Yes | 494.57 | 109.47 | 144.57 | 151.59 |
| 2H | Photoresist | Yes | 475.85 | 103.87 | 148.67 | 141.16 |
| 2I | Photoresist | Yes | 500.94 | 84.41 | 134.61 | 180.86 |
| 2J | Photoresist | Yes | 447.59 | 60.52 | 146.56 | 196.97 |
| 3A | Photoresist | None | 481.72 | 116.82 | 123.62 | 132.09 |
| 3B | Photoresist | None | 501.17 | 116.58 | 134.23 | 114.51 |
| 3C | Photoresist | None | 487.15 | 118.20 | 123.35 | 90.46 |
| 3D | Photoresist | None | 472.34 | 110.07 | 134.89 | 110.31 |
| 3E | Photoresist | None | 501.79 | 114.84 | 122.76 | 110.78 |
| 3F | Photoresist | None | 502.09 | 116.31 | 116.65 | 84.13 |
| 3G | Photoresist | None | 456.05 | 116.42 | 121.17 | 110.70 |
| 3H | Photoresist | None | 503.78 | 116.51 | 130.42 | 85.32 |
| 3I | Photoresist | None | 503.25 | 116.44 | 133.23 | 81.10 |
| 3J | Photoresist | None | 479.97 | 116.22 | 125.37 | 76.30 |

TABLE 4

| Sample No. | Composition | Surface silane | Initial Millinewtons | 2 Weeks Millinewtons | 4 Weeks Millinewtons | 8 Weeks Millinewtons |
|---|---|---|---|---|---|---|
| 4A | Photoresist + silane oligomer | Yes | 458.45 | 406.85 | 409.13 | 411.53 |
| 4B | Photoresist + silane oligomer | Yes | 456.88 | 384.54 | 402.42 | 402.53 |
| 4C | Photoresist + silane oligomer | Yes | 470.70 | 401.83 | 431.62 | 393.27 |
| 4D | Photoresist + silane oligomer | Yes | 462.11 | 395.99 | 417.27 | 418.59 |
| 4E | Photoresist + silane oligomer | Yes | 472.70 | 400.60 | 403.86 | 425.10 |
| 4F | Photoresist + silane oligomer | Yes | 464.31 | 391.15 | 426.12 | 390.94 |
| 4G | Photoresist + silane oligomer | Yes | 474.51 | 391.33 | 398.66 | 405.59 |
| 4H | Photoresist + silane oligomer | Yes | 464.78 | 394.17 | 416.47 | 399.50 |
| 4I | Photoresist + silane oligomer | Yes | 465.53 | 388.43 | 392.79 | 410.18 |
| 4J | Photoresist + silane oligomer | Yes | 476.66 | 392.08 | 408.63 | 402.48 |
| 5A | Photoresist + silane oligomer | None | 463.87 | 408.51 | 436.89 | 403.06 |
| 5B | Photoresist + silane oligomer | None | 462.63 | 402.47 | 427.07 | 417.72 |
| 5C | Photoresist + silane oligomer | None | 465.13 | 406.97 | 416.64 | 419.51 |
| 5D | Photoresist + silane oligomer | None | 465.97 | 391.88 | 432.69 | 410.42 |
| 5E | Photoresist + silane oligomer | None | 467.90 | 395.80 | 407.75 | 403.97 |
| 5F | Photoresist + silane oligomer | None | 466.43 | 392.27 | 408.26 | 423.65 |
| 5G | Photoresist + silane oligomer | None | 455.22 | 398.43 | 407.43 | 406.47 |
| 5H | Photoresist + silane oligomer | None | 462.70 | 395.01 | 420.90 | 416.88 |
| 5I | Photoresist + silane oligomer | None | 465.89 | 394.38 | 423.12 | 418.70 |
| 5J | Photoresist + silane oligomer | None | 453.65 | 391.57 | 424.94 | 417.68 |

Table 4 shows that there is a significant increase in adhesion for photoresist compositions containing the silane oligomer with a silane coated substrate surface (Samples 4A-4J) and without a silane coated substrate surface (Samples 5A-5J) as compared to the photoresist compositions of Table 2 containing a conventional silane adhesion promoter (Samples 1A-1J). Table 3 shows that a photoresist composition devoid of a silane adhesion promoter has somewhat improved adhesion when an adhesion promoter is used on the surface of the substrate (Samples 2A-2J) as compared to Samples 3A-3J which are devoid of a surface adhesion promoter.

An exemplary solvent for use in the photoresist formulation is a solvent which is non-photoreactive. Non-photoreactive solvents include, but are not limited gamma-butyrolactone, $C_{1-6}$ acetates, tetrahydrofuran, low molecular weight ketones, mixtures thereof and the like. The non-photoreactive solvent is present in the formulation mixture used to provide the photoimageable layer in an amount ranging from about 20 to about 90 weight percent, such as from about 30 to about 60 weight percent, based on the total weight of the photoresist composition. In an exemplary embodiment, the non-photoreactive solvent does not remain in the cured composite film layer and is thus removed prior to or during the composite film layer curing steps.

As described above, the photoresist composition is applied to the release film by the slot die coater and the photoresist composition is then dried with heat from a heat source at a temperature ranging from about 110° to about 150° C., typically about 130° to provide a dried photoimageable layer.

Suitable release film materials may be selected from a wide variety of flexible resilient films such as organic polymer films and metal foils, or a combination thereof that are commonly used as carrier sheet web materials. Accordingly, the release film may be selected from polyester films, polyimide films, copper clad polyimide films, copper, aluminum, nickel, brass, or stainless steel foils, and the like. Other useable release film materials include polyethylene naphthalate (PEN), polyvinyl chloride (PVC), polymethylmethacrylate (PMMA), and polycarbonate films. A particularly suitable release film may be selected from oriented polyethylene terephthalate (PET) films and polybutylene terephthalate (PBT) films having a thickness ranging from about 25 to about 250 microns.

A characteristic of the release film is that it has a surface that is wettable with the photoresist composition, but is easily released from the dried photoimageable layer when the dry film photoimageable layer is applied to a silicon substrate or to a fluid flow layers on a substrate. Another characteristic of the release film is that it provide a relatively smooth surface for application of the photoresist composition thereto so that an exposed surface of the dry film photoimageable layer is relatively smooth.

In order to improve the smoothness of an exposed surface of the dry film photoimageable layer, a conformal release coating may be interposed between the release film and the photoimageable layer to provide a composite structure. The conformal release coating may be selected from silicone release layers, acrylate release layers, fluorocarbon release layers and the like. A particularly conformal suitable release coating is urethane acrylic/silicone hybrid cured release coating commercially available from Dainichiseika Color & Chemicals Mfg. Co., Ltd. of Tokyo, Japan, under the trade name SEIKABEAM EXY-10(NS), having a thickness ranging from about 20 to about 100 nanometers, typically about 50 nanometers. The conformal release coating may be applied to the release film by a wide variety of conventional web coating techniques including, but not limited to, rotogravure coating, blade coating, spray coating, screen printing, and the like. One suitable method for applying the conformal release coating to the release film may be a microgravure coating method. The release film to which the conformal release coating is applied may be corona treated on at least a surface to which the release coating is applied to improve adhesion between the release coating and the release film.

Figure 3:
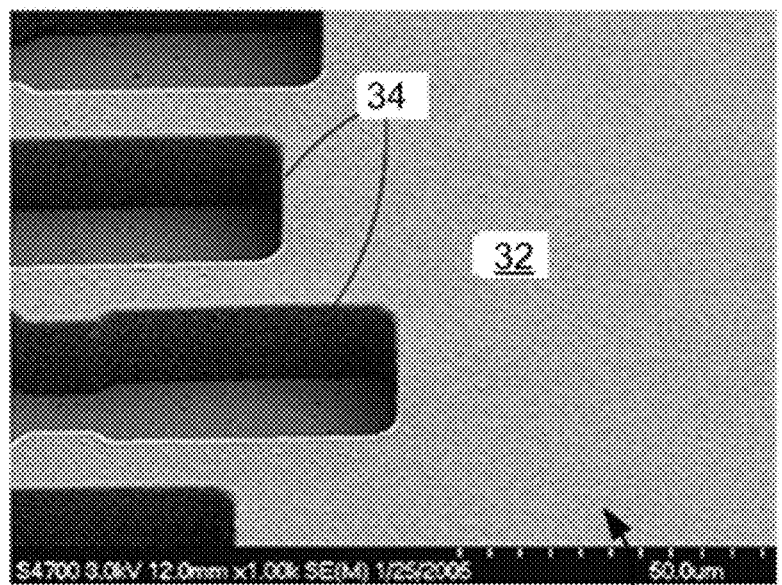
FIG. 3 is photomicrograph of a portion of a fluid flow layer made from a photoresist material described herein for a fluidic ejection head.

Upon removal of the release film and release coating from the dry film photoimageable layer 30 the photoimageable layer 30 has a surface 32, as illustrated in FIG. 3 that may have a surface roughness (Ra) value of less than about 20 nanometers and a maximum peak to valley (Rt) value of less than 1 micron. Likewise, flow features such as fluid ejection chambers 34 in the photoimageable layer 30 are uniform and smooth.

Figure 4:
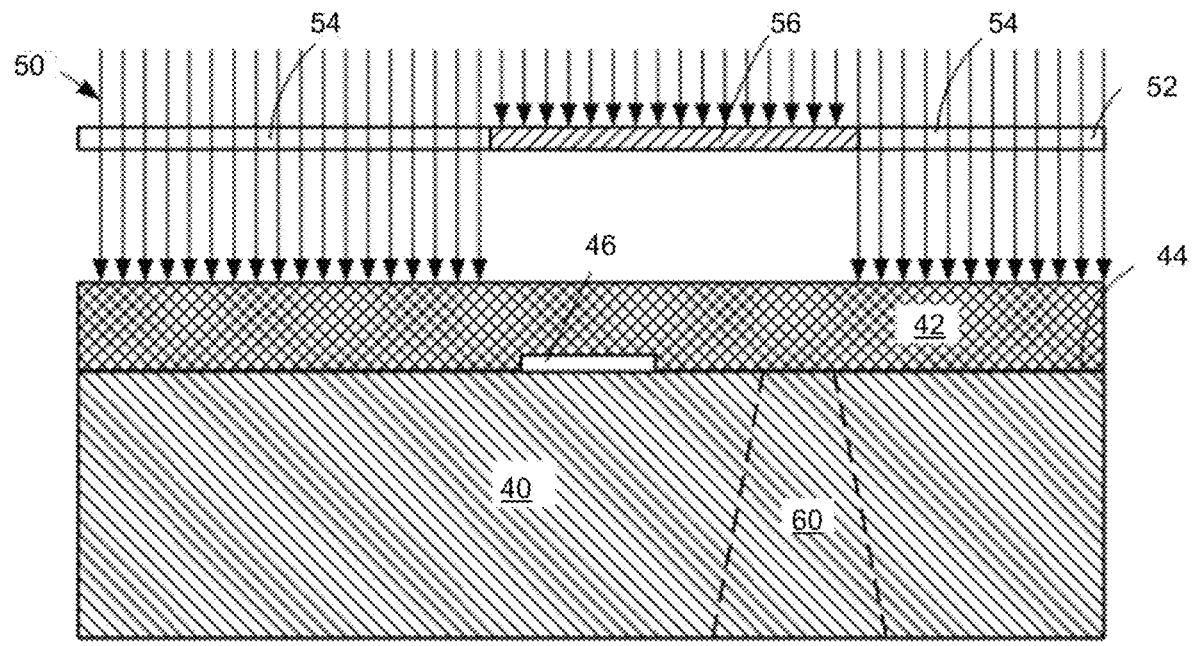
FIGS. 4-5 illustrate a method for imaging and developing a fluid flow layer made from a photoresist material described herein for making a fluidic ejection head.

With reference now to FIGS. 4-8, a method for making a fluidic ejection head 12 according to an embodiment of the disclosure will now be described. As an initial step in the process of constructing the fluidic ejection head 12, a photoimageable layer 30 is applied to a device surface of a wafer containing a plurality of individual silicon substrates 40 to provide a flow feature layer 42 on a surface 44 of the substrates 40 as shown in FIG. 4. Each of the substrates 40 is relatively small in size and typically has overall dimensions ranging from about 2 to about 10 millimeters wide by about 10 to about 25 millimeters long and from about 0.4 to about 0.8 mm thick. The substrates 40 may be silicon, ceramic, or other substrate wafer material containing a plurality of fluid ejection actuators such as piezoelectric devices or heater resistors 46 formed on the surface 44 of the substrates 40. The heater resistors 46 may be formed on the surface 44 of the substrate by well-known semiconductor manufacturing techniques. In addition to the heater resistors 46, the surface 44 of the substrate may include active and passive logic devices, heater selection circuits, and insulative, conductive, and resistive layers.

The surface 44 of the substrates 40 also contains electrical traces 22 from the heater resistors 46 to the electrical contacts 20 used for connecting the substrates 40 to the flexible circuit 18 (FIG. 1) or a tape automated bonding (TAB) circuit for supplying electrical impulses from a fluid ejection controller to activate one or more of the heater resistors 46.

The fluid flow layer 42 may be provided by a positive or negative photoresist material and may be applied to the surface 44 of the substrate 40 by a spin coating method or as a dry film photoimageable layer using heat and pressure. After applying the fluid flow layer 42 to the surface 44 of the substrates 40, flow features may then be formed in the fluid flow layer 42 using conventional photoimaging techniques such as ultraviolet radiation, indicated by arrows 50 with wavelengths typically in the range of from about 193 to about 450 nanometers. A mask 52 having transparent areas 54 and opaque areas 56 may be used to define the flow features in the fluid flow layer 42. The imaged fluid flow layer 42 may be developed using standard photolithographic developing techniques.

Figure 5:
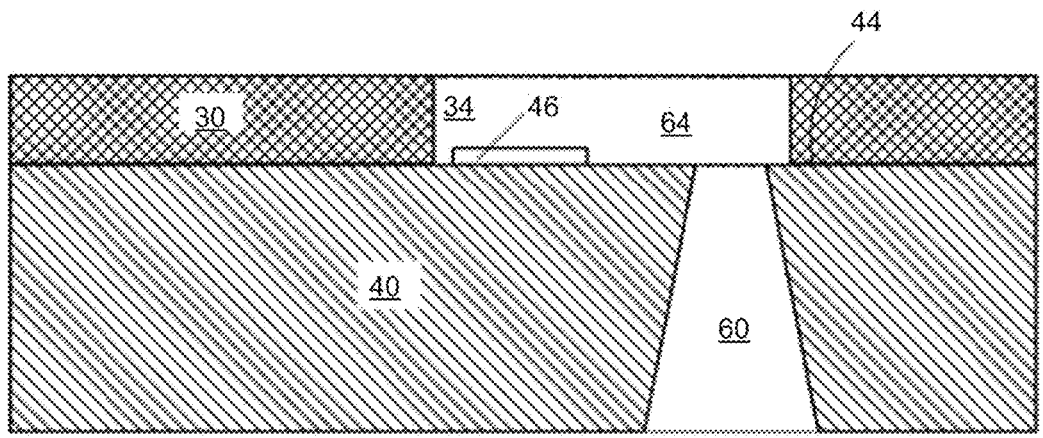

Before or after applying the fluid flow layer 42 to the wafer containing the substrates 40 and before or after imaging and developing the fluid flow layer 42, one or more fluid supply slots 60 may be formed through the substrates 40 as shown in FIG. 5. The fluid supply slots 60 typically have dimensions of about 9.7 millimeters long and 0.39 millimeters wide. Techniques used for forming the slots 60 may be selected from wet and dry etch techniques or mechanical techniques such as grit blast.

Figure 6:
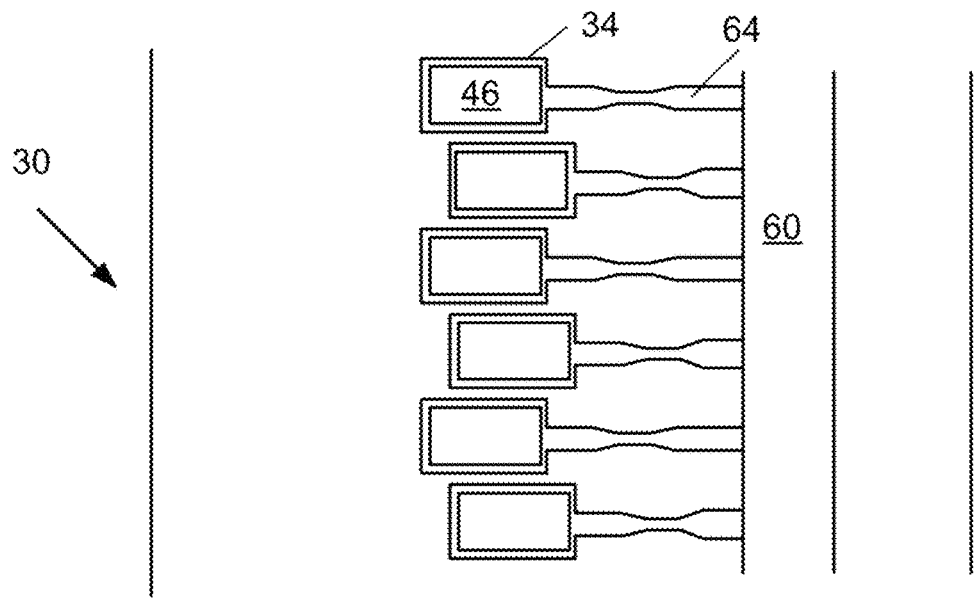
FIG. 6 is a plan view, of flow features in a fluid flow layer made from a photoresist material described herein.

Once developed, the developed fluid flow layer 30 may contain fluid supply channels, such as supply channel 64 in flow communication with the slot 60 to provide fluid to fluid ejection chambers, such as fluid ejection chamber 34 as shown in FIGS. 3, 5 and 6. There is typically one fluid ejection chamber 34 and one fluid supply channel 64 for each fluid ejection actuator 46.

Figure 7:
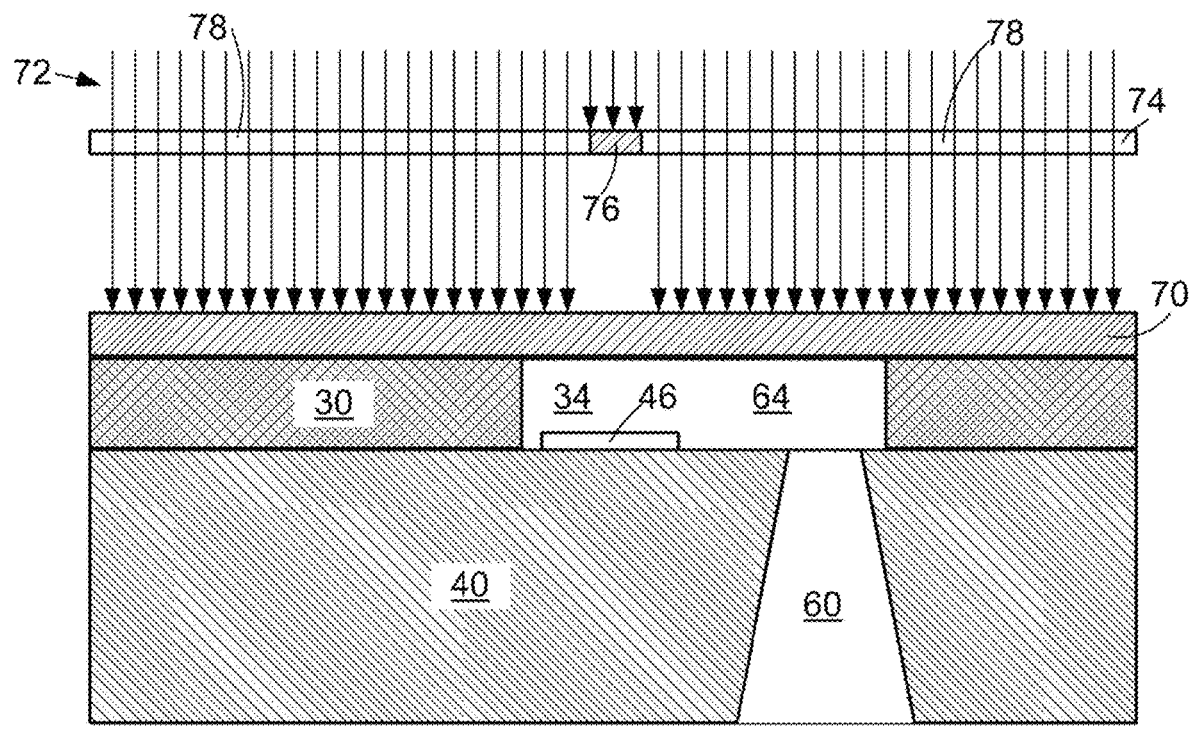
FIG. 7 illustrates a method for making a nozzle plate from a photoresist material for a fluidic ejection head according to the disclosure.

The resulting composite substrate/fluid flow layer 40/30 is referred to herein as a fluidic ejection head structure. Next, as shown in FIG. 7, the photoimageable thick film layer 70, is applied to the imaged and developed fluid flow layer 30 by a lamination technique. The lamination technique may include heat and pressure to fixedly attach the photoimageable thick film layer 70 to the fluid flow layer 30. For example, lamination of the photoimageable thick film layer 70 to the fluidic ejection head structure may be effected using heat and/or pressure in a single or double roll laminator or in a vacuum laminator. Desirable temperature and pressure conditions for laminating the photoimageable thick film layer 70 to the fluid flow layer 30 may be in the range of from about 30° to about 150° C. and from about 5 to about 80 psig. The thick film layer may have a thickness ranging from about 10 to about 30 microns.

Nozzles are formed in the photoimageable thick film layer 70 using a photo imaging technique similar to the technique described above with respect to imaging the fluid flow layer 42. Accordingly, ultraviolet radiation indicated by arrow 72 and a mask 74 containing an opaque area 76 and transparent areas 78 is used to form the nozzles holes in the photoimageable thick film layer 70. After imaging the photoimageable thick film layer 70, a suitable solvent is used to dissolve the non-imaged areas providing a nozzle plate 16 containing nozzles 82 as shown in FIG. 8.

An advantage of laminating a dry film photoresist layer to the fluidic ejection head structures is that the process enables wafer level processing of the ejection head. Wafer level processing means that separate processing steps for a nozzle plate and the fluidic ejection head structure may be eliminated in favor of photoimaging and developing the thick film layer 70 once the thick film layer 70 is laminated to the fluidic ejection head structure. Accordingly, laser ablation steps for individual nozzle plates as well as alignment tolerances, adhesives, and/or thermal compression bonding techniques used to attach conventional nozzle plates to the fluidic ejection head structure are avoided.

Figure 8:
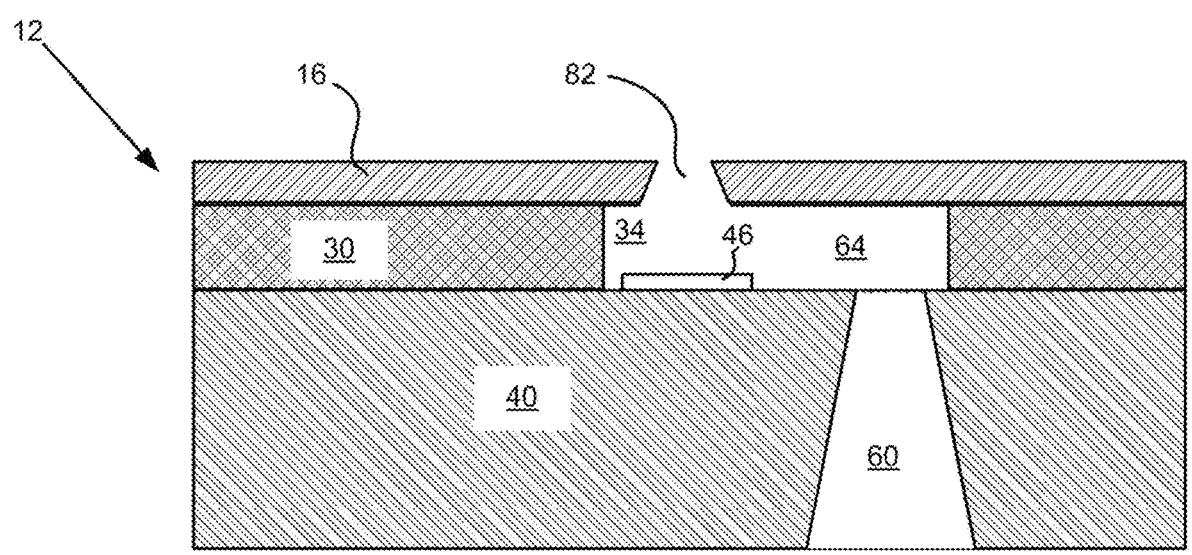
FIG. 8 is a cross-sectional view, not to scale, of a portion of a fluidic ejection head containing a fluid flow layer and a nozzle plate made from a photoresist material.

Individual fluidic ejection heads 12 may be excised from the wafer containing a plurality of ejection heads 12 to provide the ejection head illustrated in FIG. 8. Upon activation of the heater resistors 46, fluid supplied through the slot 60 in the substrate 40 through the channels 64 to the chambers 34 is caused to be ejected through nozzles 82 in the nozzle plate 16 toward a medium.

The fluidic ejection head 12 may be attached in a well-known manner to a chip pocket in a cartridge body 14 to form fluid ejection cartridge 10 as shown in FIG. 1. Fluid to be ejected is supplied to the fluidic ejection head 12 from a fluid reservoir in the cartridge body 14 generally opposite the chip pocket. In an alternative, a remote fluid supply may be used to provide fluid to be ejected by the fluidic ejection head 12.

The cartridge body 14 may be made of a wide variety of materials, including but not limited to, metal, glass, ceramic, or a polymeric material selected from the group consisting of amorphous thermoplastic polyetherimide, glass filled thermoplastic polyethylene terephthalate resin, syndiotactic polystyrene containing glass fiber available, polyphenylene oxide/high impact polystyrene resin blend, and polyamide/polyphenylene ether resin.

Other embodiments of the present disclosure will be apparent to those skilled in the art from consideration of the specification and practice of the embodiments disclosed herein. As used throughout the specification and claims, "a" and/or "an" may refer to one or more than one. Unless otherwise indicated, all numbers expressing quantities of ingredients, properties such as molecular weight, percent, ratio, reaction conditions, and so forth used in the specification and claims are to be understood as being modified in all instances by the term "about." Accordingly, unless indicated to the contrary, the numerical parameters set forth in the specification and claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. It is intended that the specification and examples be considered as exemplary only, with a true scope and spirit of the invention being indicated by the following claims.

The patentees do not intend to dedicate any disclosed embodiments to the public, and to the extent any disclosed modifications or alterations may not literally fall within the scope of the claims, they are considered to be part hereof under the doctrine of equivalents.

What is claimed is:

1. An improved photoimageable dry film formulation, the dry film formulation comprising a multifunctional epoxy compound, a photoinitiator capable of generating a cation, a non-photoreactive solvent, and from about 0.5 to about 5% by weight a silane oligomer adhesion enhancer based on a total weight of the photoimageable dry film formulation before drying, wherein the silane oligomer adhesion enhancer is a gamma-glycidoxypropyltrimethoxysilane oligomer of the formula

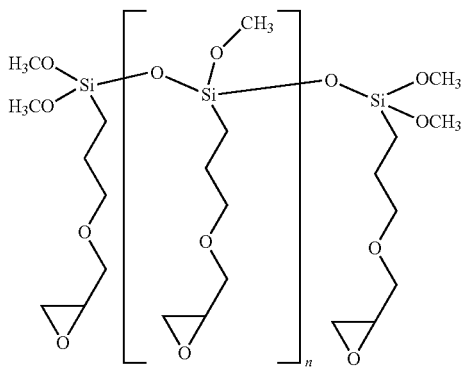

wherein n ranges from 1 to 4.

2. The improved photoimageable dry film formulation of claim 1, wherein the formulation comprises from about 1 to about 3 wt. % of the silane oligomer adhesion enhancer based on a total weight of the photoimageable dry film formulation before drying.

3. The improved photoimageable dry film formulation of claim 1, wherein the solvent comprises an aliphatic ketone solvent.

4. The improved photoimageable dry film formulation of claim 3, wherein the aliphatic ketone solvent comprises cyclohexanone, and optionally, acetone.

5. The improved photoimageable dry film formulation of claim 1, wherein a dry film laminate made from the photoimageable dry film formulation is applied to a silicon semiconductor substrate.

6. The improved photoimageable dry film formulation of claim 1, wherein a dry film laminate made from the photoimageable dry film formulation is applied to a flow feature layer of a fluidic ejection head.

7. A method for making an improved fluidic ejection head, the method comprising the steps of:

applying a photoresist layer to a release film, wherein the photoresist layer is derived from a photoimageable dry film formulation comprising a multi-functional epoxy compound, a photoacid generator, a silane oligomer adhesion enhancer is a gamma-glycidoxypropyltrimethoxysilane oligomer of the formula

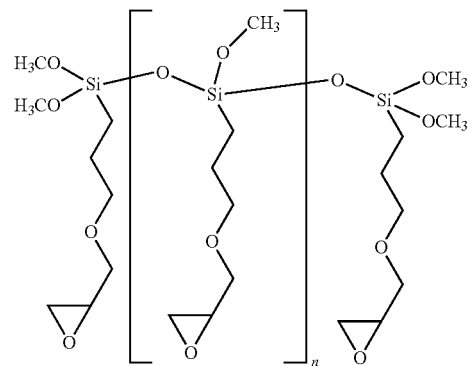

wherein n ranges from 1 to 4, and an aryl ketone solvent;

drying the photoimageable dry film formulation on the release film layer to provide a thick film layer;

laminating the thick film layer to a flow feature layer on a semiconductor substrate;

removing the release film from the thick film layer;

imaging a nozzle hole in the thick film layer; and developing the imaged thick film layer to provide a nozzle plate for the fluidic ejection head.

8. The method of claim 7, wherein the photoimageable dry film formulation comprises from about 1 to about 3 wt. % of the silane oligomer adhesion enhancer based on a total weight of the photoimageable dry film formulation before drying.

9. The method of claim 7, wherein the solvent comprises an aliphatic ketone solvent.

10. The method of claim 9, wherein the aliphatic ketone solvent comprises cyclohexanone, and optionally, acetone.

11. The method of claim 7, wherein the photoresist composition on the release film is dried at a temperature ranging from about 110° to about 150° C.

12. A fluidic ejection head for ejecting a fluid composition comprising:

a semiconductor substrate containing fluid ejection devices thereon, a flow feature layer disposed on the semiconductor substrate, and a thick film layer laminated to the flow feature layer, wherein the thick film layer is derived from a photoimageable dry film formulation comprising a multifunctional epoxy compound, a photoinitiator capable of generating a cation, a non-photoreactive solvent, and from about 0.5 to about 5% by weight a silane oligomer adhesion enhancer based on a total weight of the photoimageable dry film formulation before drying, wherein the silane oligomer adhesion enhancer is a gamma-glycidoxypropyltrimethoxysilane oligomer of the formula

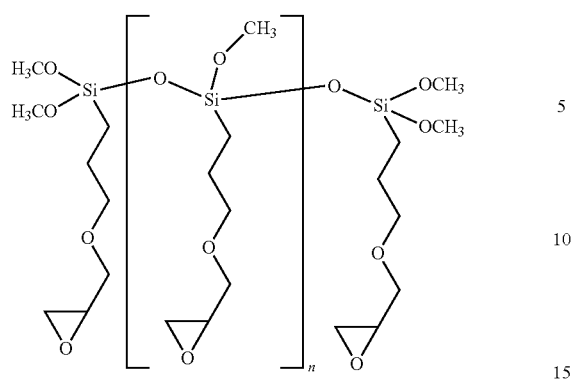

wherein n ranges from 1 to 4.

13. The fluidic ejection head of claim 12, wherein the photoimageable dry film formulation comprises from about 1 to about 3 wt. % of the silane oligomer adhesion enhancer based on a total weight of the photoimageable dry film formulation before drying.

14. The fluidic ejection head of claim 12, wherein the solvent comprises cyclohexanone, and optionally, acetone.

* * * * *